(12) United States Patent
Lee

(10) Patent No.: US 7,944,233 B1
(45) Date of Patent: May 17, 2011

(54) DATA OUTPUT CIRCUIT

(75) Inventor: Geun-Il Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/647,114

(22) Filed: Dec. 24, 2009

(30) Foreign Application Priority Data

Nov. 30, 2009 (KR) .................. 10-2009-0117388

(51) Int. Cl.
*H03K 17/16* (2006.01)
*H03K 19/003* (2006.01)

(52) U.S. Cl. .................. 326/30; 326/33; 326/34; 326/27

(58) Field of Classification Search .................. None
See application file for complete search history.

(56) References Cited

U.S. PATENT DOCUMENTS 7,227,382 B1 * 6/2007 Talbot et al. .................. 326/87
7,489,159 B2 * 2/2009 Kim .................. 326/30

FOREIGN PATENT DOCUMENTS

KR 1020070036571 4/2007
KR 1020090039295 4/2009

OTHER PUBLICATIONS

Notice of Allowance issued from Korean Intellectual Property Office on Mar. 29, 2011.

* cited by examiner

*Primary Examiner* — Anh Q Tran
(74) *Attorney, Agent, or Firm* — IP & T Group LLP

(57) ABSTRACT

A data output circuit includes a plurality of drivers configured to be turned on/off according to impedance codes to output data to an output node. The impedance codes are divided into a first group having a value to turn on the drivers, and a second group having a value to turn off the drivers, and at least some of the drivers controlled by the second group are turned on during a pre-emphasis period.

12 Claims, 9 Drawing Sheets

DATA OUTPUT CIRCUIT

CROSS-REFERENCE TO RELATED APPLICATIONS

The present application claims priority of Korean Patent Application No. 10-2009-0117388, filed on Nov. 30, 2009, which is incorporated herein by reference in its entirety.

BACKGROUND OF THE INVENTION

Exemplary embodiments of the present invention relate to a data output circuit for outputting data in various types of semiconductor chips.

FIG. 1 is a block diagram of a conventional data output circuit.

Referring to FIG. 1, the conventional data output circuit includes an output unit 110 and a pre-emphasis unit 120.

The output unit 110 includes an output driver configured to output data through a data pad. The output unit 110 includes a pull-up driver 111 and a pull-down driver 112.

The pull-up driver 111 is turned on when data P_DATA becomes a logic high level, and pulls up a data pad DQ. When the pull-up driver 111 pulls up the data pad DQ, the data pad DQ becomes a logic high level and high data is output. The pull-down driver 112 is turned on when data N_DATA becomes a logic low level, and pulls down the data pad DQ. When the pull-down driver 112 pulls down the data pad DQ, the data pad DQ becomes a logic low level and low data is output. Impedance codes PCODE<0:5> and NCODE<0:5> inputted to the pull-up driver 111 and the pull-down driver 112 are codes for calibrating resistances of the pull-up driver 111 and the pull-down driver 112. The impedance codes PCODE<0:5> and NCODE<0:5> are generated from a calibration circuit disposed near a ZQ pad (not shown). Specifically, which one of the pull-up driver 111 and the pull-down driver 112 of the output unit 110 is turned on is determined according to the logic values of the data P_DATA and N_DATA. The resistances of the pull-up driver 111 and the pull-down driver 112 when they are turned on are determined by the impedance codes PCODE<0:5> and NCODE<0:5>.

The pre-emphasis unit 120 performs a pre-emphasis operation which increases the drivability of output data upon transition of the data P_DATA and N_DATA. The pre-emphasis unit 120 includes a pull-up pre-emphasis driver 121 and a pull-down emphasis driver 122.

The pull-up emphasis driver 121 is turned on when emphasis data PPE_DATA is a logic high level, and drives the data pad DQ to a logic high level. The pull-down emphasis driver 122 is turned on when emphasis data NPE_DATA is a logic low level, and drives the data pad DQ to a logic low level. The emphasis data PPE_DATA has a logic high level when it transitions from a logic low level to a logic high level, and the emphasis data NPE_DATA has a logic low level when it transitions from a logic high level to a logic high level. The pre-emphasis unit 120 drives the data pad DQ together with the output unit 110 upon transition of the data P_DATA and N_DATA, thereby increasing the drivability of data. Codes PPRE<0:2> and NPRE<0:2> inputted to the pre-emphasis unit 120 are codes for setting the impedance of the pre-emphasis unit 120. The impedance of the pre-emphasis unit 120 is set by a mode register set (MRS). As the impedance of the pre-emphasis unit 120 is decreased, the pre-emphasis operation is increased. On the other hand, as the impedance of the pre-emphasis unit 120 is increased, the pre-emphasis operation is decreased.

FIG. 2 is a timing diagram illustrating the operation of the data output circuit of FIG. 1.

As can been seen from FIG. 2, the data P_DATA and N_DATA are driven to the data pad DQ by the pull-up driver 111 and the pull-down driver 112. In addition, the emphasis data PPE_DATA and NPE_DATA are activated during the transition of the data P_DATA and N_DATA, and the pre-emphasis unit 120 operates to improve driving the data of the data pad DQ.

When the pre-emphasis operation is applied to the output circuit, output data characteristics are greatly improved. However, the addition of the driver for the pre-emphasis operation increases the area of the output circuit and the capacitance of the output terminal, causing a slew rate reduction.

SUMMARY OF THE INVENTION

An embodiment of the present invention is directed to a data output circuit which performs a pre-emphasis or de-emphasis operation, without any addition of a pre-emphasis or de-emphasis driver.

In accordance with an embodiment of the present invention, a data output circuit includes: a plurality of drivers configured to be turned on/off according to impedance codes to output data to an output node, wherein the impedance codes are divided into a first group having a value to selectively turn on the drivers, and a second group having a value to turn off the drivers, and at least some of the drivers controlled by the second group are turned on during a pre-emphasis period.

The number of the drivers, selected from among the drivers controlled by the second group, may be turned on during the pre-emphasis period according to pre-emphasis codes.

In accordance with another embodiment of the present invention, a data output circuit includes: a pull-up driver including a plurality of pull-up resistors to pull up an output node; a pull-down driver including a plurality of pull-down resistors to pull down the output node; a pull-up controller configured to turn on/off the plurality of pull-up resistors according to pull-up impedance codes when high data is output, and to further turn on at least some of the pull-up resistors turned off according to the pull-up impedance codes during a pre-emphasis period; and a pull-down controller configured to turn on/off the plurality of pull-down resistors according to pull-down impedance codes when low data is output, and to further turn on at least some of the pull-down resistors turned off according to the pull-down impedance codes during the pre-emphasis period.

In accordance with yet another embodiment of the present invention, a data output circuit includes: an impedance code generator configured to generate pull-up impedance codes for determining a pull-up impedance value of the data output circuit, and to generate pull-down impedance codes for determining a pull-down impedance value of the data output circuit; a pull-up driver including a plurality of pull-up resistors to pull up a data pad; a pull-down driver a plurality of pull-down resistors to pull down the data pad; a pull-up controller configured to turn on/off the plurality of pull-up resistors according to the pull-up impedance codes upon high data being output, and to further turn on at least some of the pull-up resistors turned off according to the pull-up impedance codes during a pre-emphasis period; and a pull-down controller configured to turn on/off the plurality of pull-down resistors according to the pull-down impedance codes upon low data being output, and to further turn on at least some of the pull-down resistors turned off according to the pull-down impedance codes during the pre-emphasis period.

In accordance with still another embodiment of the present invention, a data output circuit includes: a pull-up driver including a plurality of pull-up resistors to pull up an output node; a pull-down driver including a plurality of pull-down resistors to pull down the output node; a pull-up controller configured to turn on/off the plurality of pull-up resistors according to pull-up impedance codes upon high data being output, and to further turn on some of the pull-up resistors during a de-emphasis period upon low data being output; and a pull-down controller configured to turn on/off the plurality of pull-down resistors according to pull-down impedance codes upon low data being output, and to further turn on some of the pull-down resistors during a de-emphasis period upon high data being output.

DESCRIPTION OF SPECIFIC EMBODIMENTS

Figure 1:
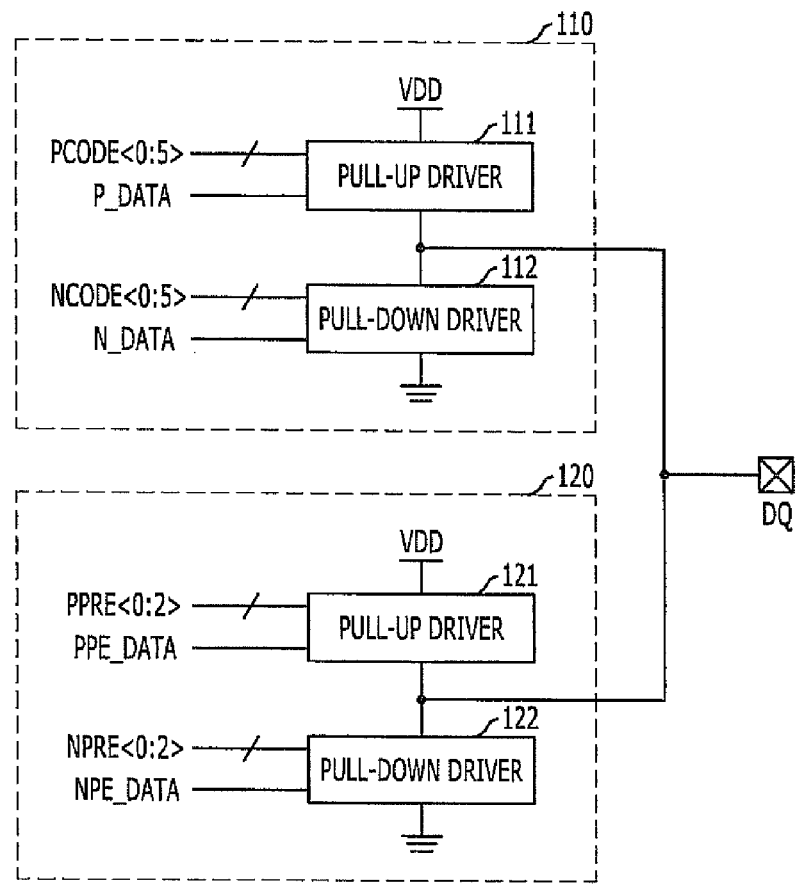
FIG. 1 is a block diagram of a conventional data output circuit.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
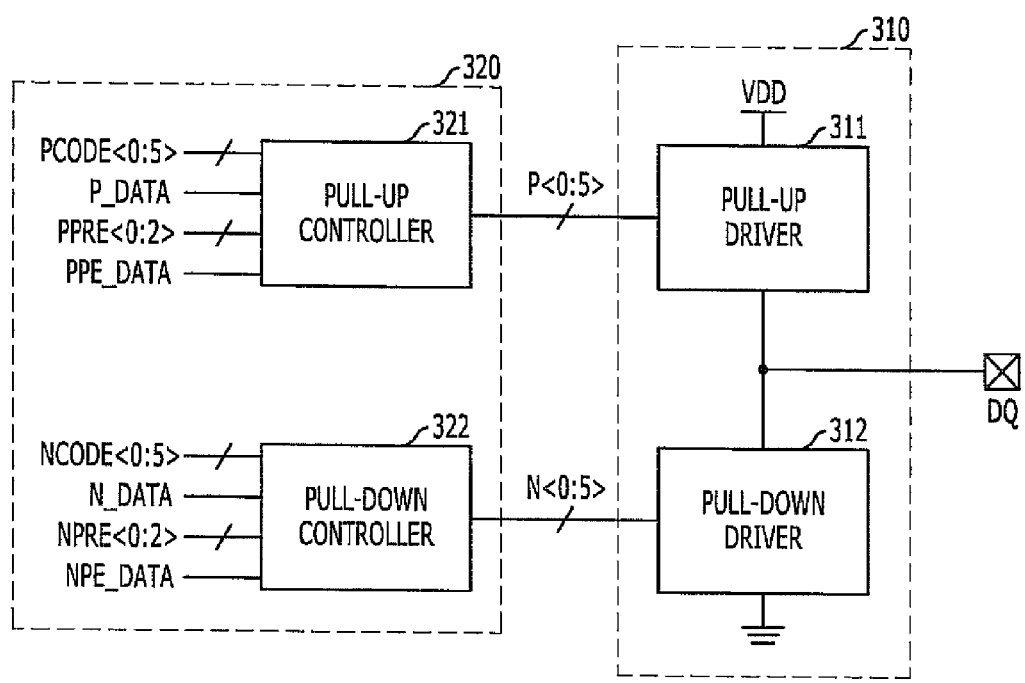
FIG. 3 is a block diagram of a data output circuit in accordance with an embodiment of the present invention.

FIG. 3 is a block diagram of a data output circuit in accordance with an embodiment of the present invention.

Referring to FIG. 3, the data output circuit in accordance with the embodiment of the present invention includes an output unit 310 and a control unit 320. The output unit 310 is configured to output data P_DATA and N_DATA to an output node DQ. The control unit 320 is configured to determine an impedance of the output unit 310 according to pull-up and pull-down impedance codes PCODE<0:5> and NCODE<0:5>. Herein, the impedance of the output unit 310 is controlled to be less than a value determined by the pull-up and pull-down impedance codes PCODE<0:5> and NCODE<0:5> during a pre-emphasis period.

The output unit 310 includes a pull-up driver 311 and a pull-down driver 312. The pull-up driver 311 includes a plurality of pull-up resistors connected in parallel, and pulls up the output node DQ by using the plurality of pull-up resistors. As the number of pull-up resistors which pull up the output node DQ increases, the impedance of the output node DQ decreases. As the impedance of the output node DQ decreases, the drivability of the pull-up driver 311 is increased. The pull-down driver 312 includes a plurality of pull-down resistors connected in parallel, and pulls down the output node DQ by using the plurality of pull-down resistors. As the number of the pull-down resistors which pull down the output node DQ increases, the impedance of the pull-down driver 312 decreases. As the impedance of the output node DQ decreases, the drivability of the pull-down driver 312 is increased.

The control unit 320 includes a pull-up controller 321 configured to control the pull-up driver 311, and a pull-down controller 322 configured to control the pull-down driver 312.

The pull-up controller 321 controls the pull-up driver 311 to pull up the output node DQ when the data P_DATA is a logic high level. When the pull-up driver 311 drives the output node DQ, which pull-up resistors provided within the pull-up driver 311 are turned on is determined by the pull-up impedance codes PCODE<0:5>. For example, the pull-up impedance code PCODE<0> determines whether to turn on the zeroth pull-up resistor, and the pull-up impedance code PCODE<2> determines whether to turn on the second pull-up resistor. That is, the pull-up controller 321 controls the pull-up driver 311 to pull up the output node DQ when the data P_DATA is a logic high level, and determines the impedance of the pull-up driver 311 according to the pull-up impedance codes PCODE<0:5>.

Unless the impedance of the pull-up driver 311 is minimized by the pull-up impedance codes PCODE<0:5>, some of the pull-up resistors constituting the pull-up driver 311 are turned off. The pull-up controller 321 performs a pre-emphasis driving operation by using the pull-up resistors which have been turned off. That is, upon the pre-emphasis driving operation, the pull-up resistors having been placed in the turned-off state during the normal driving operation are then turned on, so that the impedance of the pull-up driver 311 is decreased. In this way, the pre-emphasis driving operation is performed. For example, in case where the zeroth, second and fourth pull-up resistors are set to be turned on by the pull-up impedance codes PCODE<0:5>, and thus the first, third and fifth pull-up resistors have been turned off, the pull-up controller 321 turns on the first, third and fifth pull-up resistors during the pre-emphasis driving operation, thereby increasing the drivability of the pull-up driver 311.

Pull-up pre-emphasis data PPE_DATA is a signal which maintains a logic high level during a period where the pull-up driver 311 must perform the pre-emphasis driving operation, and pull-up pre-emphasis codes PPRE<0:2> are codes which determine the pre-emphasis drivability. The number of pull-up resistors to be turned on during the pre-emphasis operation is determined according to the pull-up pre-emphasis codes PPRE<0:2>. The pull-up pre-emphasis codes PPRE<0:2> may be determined by an initial setting such as a mode register set (MRS).

The pull-down controller 322 controls the pull-down driver 312 to pull down the output node DQ when the data N_DATA is a logic low level. When the pull-down driver 312 drives the output node DQ, which pull-down resistors provided inside the pull-down driver 312 are turned on is determined by the pull-down impedance codes NCODE<0:5>. For example, the pull-down impedance code NCODE<1> determines whether to turn on the first pull-down resistor, and the pull-down impedance code NCODE<3> determines whether to turn on the third pull-down resistor. That is, the pull-down controller 322 controls the pull-downs driver 312 to pull down the output node DQ when the data N_DATA is a logic low level, and determines the impedance of the pull-down driver 312 according to the pull-down impedance codes NCODE<0:5>.

Unless the impedance of the pull-down driver 312 is minimized by the pull-down impedance codes NCODE<0:5>, some of the pull-down resistors constituting the pull-down driver 312 have been turned off. The pull-down controller 322 performs a pre-emphasis driving operation by using the pull-down resistors that have been turned off. That is, upon the pre-emphasis driving operation, the pull-down resistors that have been in the turned-off state during the normal driving operation are turned on, so that the impedance of the pull-down driver 312 is decreased. In this way, the pre-emphasis driving operation is performed. For example, in case where the zeroth, first, second and fifth pull-down resistors are set to be turned on by the pull-down impedance codes NCODE<0:5>, and thus the third and fourth pull-down resistors have been turned off, the pull-down controller 322 turns on the third and fourth pull-down resistors during the pre-emphasis driving operation, thereby increasing the drivability of the pull-down driver 312.

The pull-down pre-emphasis data NPE_DATA is a signal which maintains a logic low level during a period where the pull-down driver 312 must perform the pre-emphasis driving operation, and pull-down pre-emphasis codes NPRE<0:2> are codes which determine the pre-emphasis drivability. The number of pull-down resistors to be further turned on during the pre-emphasis operation is determined according to the pull-down pre-emphasis codes NPRE<0:2>. The pull-down pre-emphasis codes NPRE<0:2> may be determined by an initial setting such as a mode register set (MRS).

Figure 2:
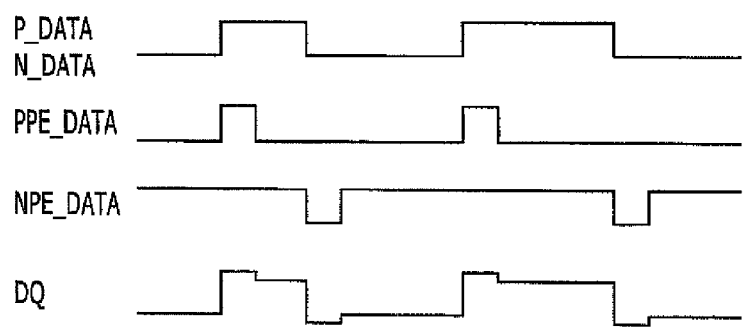
FIG. 2 is a timing diagram illustrating an operation of the data output circuit of FIG. 1.

The relationship of the data P_DATA and N_DATA, the pull-up pre-emphasis data PPE_DATA, and the pull-down pre-emphasis data NPE_DATA can be understood more clearly with reference to FIG. 2.

Although the data P_DATA inputted to the pull-up controller 321 and the data N_DATA inputted to the pull-down controller 322 are represented by different symbols, the two data P_DATA and N_DATA have the same level during the data output.

In summary, the data output circuit of FIG. 3 includes a plurality of drivers (resistors within the output unit 310) configured to be turned on/off according to the pull-up and pull-down impedance codes PCODE<0:5> and NCODE<0:5> to output the data P_DATA and N_DATA to the output node DQ. The pull-up and pull-down impedance codes PCODE<0:5> and NCODE<0:5> are divided into a first group having a value to turn on the drivers (codes having a 'L" value among PCODE<0:5> and codes having a 'H' value among NCODE<0:5>) and a second group having a value to turn off the drivers (codes having a 'H' value among PCODE<0:5> and codes having a 'L' value among NCODE<0:5>). The pre-emphasis driving operation for increasing the drivability is achieved by further turning on at least some of the drivers controlled by the second group during the pre-emphasis period.

Figure 4:
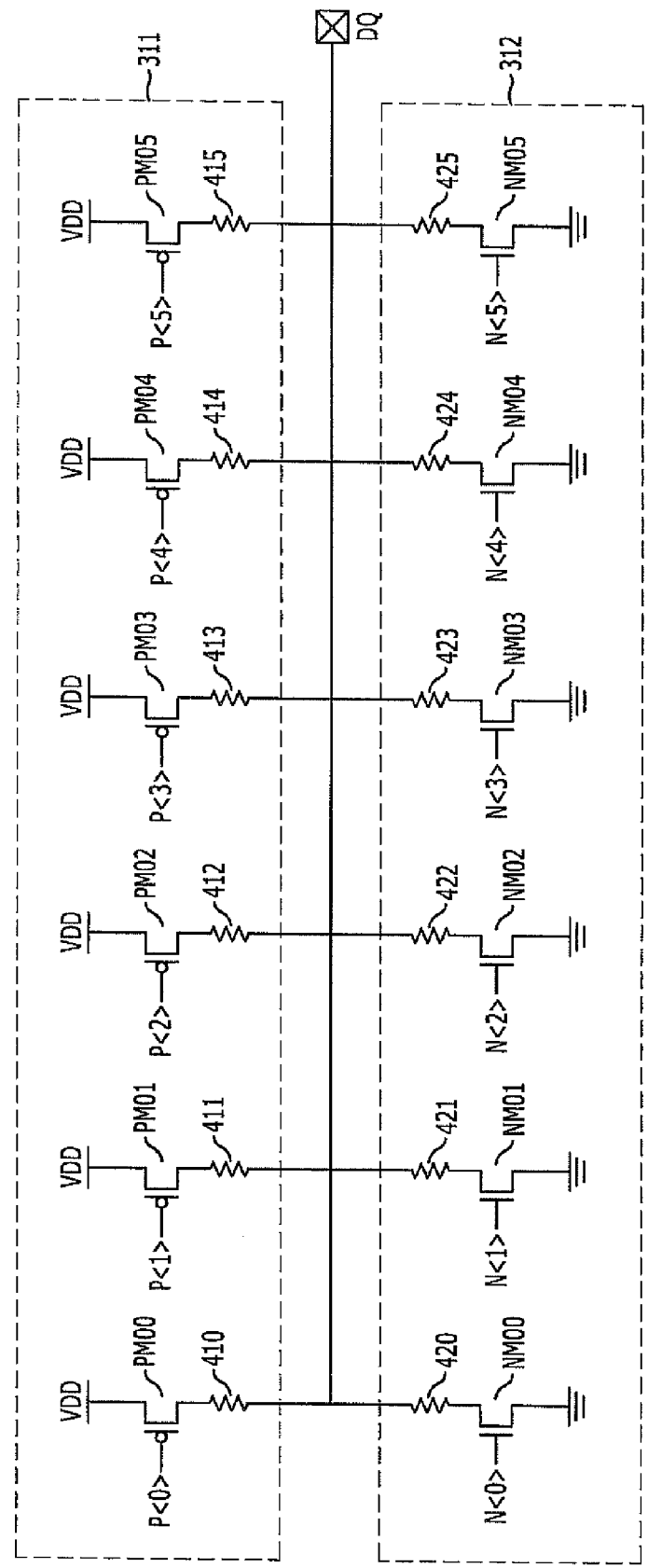
FIG. 4 is a circuit diagram of a pull-up driver and a pull-down driver illustrated in FIG. 3.

FIG. 4 is a circuit diagram of the pull-up driver 311 and the pull-down driver 312 of the output unit 310 illustrated in FIG. 3.

Referring to FIG. 4, the pull-up driver 311 includes a plurality of pull-up resistors 410 to 415 respectively coupled in series to a plurality of transistors PM00 to PM05. The transistors PM00 to PM05 are turned on/off in response to pull-up control signals P<0:5>. When the pull-up control signals P<0:5> are low, the transistors PM00 to PM05 are turned on, so that the pull-up resistors 410 to 415 pull up the output node DQ. When the pull-up control signals P<0:5> are high, the transistors PM00 to PM05 are turned off, so that the pull-up resistors 410 to 415 do not drive the output node DQ.

The pull-down driver 312 includes a plurality of pull-down resistors 420 to 425 respectively coupled in series to a plurality of transistors NM00 to NM05. The transistors NM00 to NM05 are turned on/off in response to pull-down control signals N<0:5>. When the pull-down control signals N<0:5> are high, the transistors NM00 to NM05 are turned on, so that the pull-down resistors 420 to 425 pull down the output node DQ. When the pull-down control signals N<0:5> are low, the transistors NM00 to NM05 are turned off, so that the pull-down resistors 420 to 425 do not drive the output node DQ.

In FIG. 4, the transistors NM00 to NM05 for turning on/off the pull-up resistors 410 to 415 and the transistors PM00 to PM05 for turning on/off the pull-down resistors 420 to 425 are separately illustrated. However, it is apparent that the transistors NM00 to NM05 and PM00 to PM05 may be configured to perform both functions of the resistors and the transistors, without the pull-up and pull-down resistors 410 to 415 and 420 to 425, because they have resistance components in themselves. That is, the output unit 310 may be configured with only the transistors NM00 to NM05 and PM00 to PM05, without the pull-up and pull-down resistors 410 to 415 and 420 to 425.

Therefore, the pull-up resistors in this embodiment may refer to the resistors for pulling up the output node or the pull-up transistors having resistance components, and the pull-down resistors in this embodiment may refer to the resistors for pulling down the output node or the pull-down transistors having resistance components.

Figure 5:
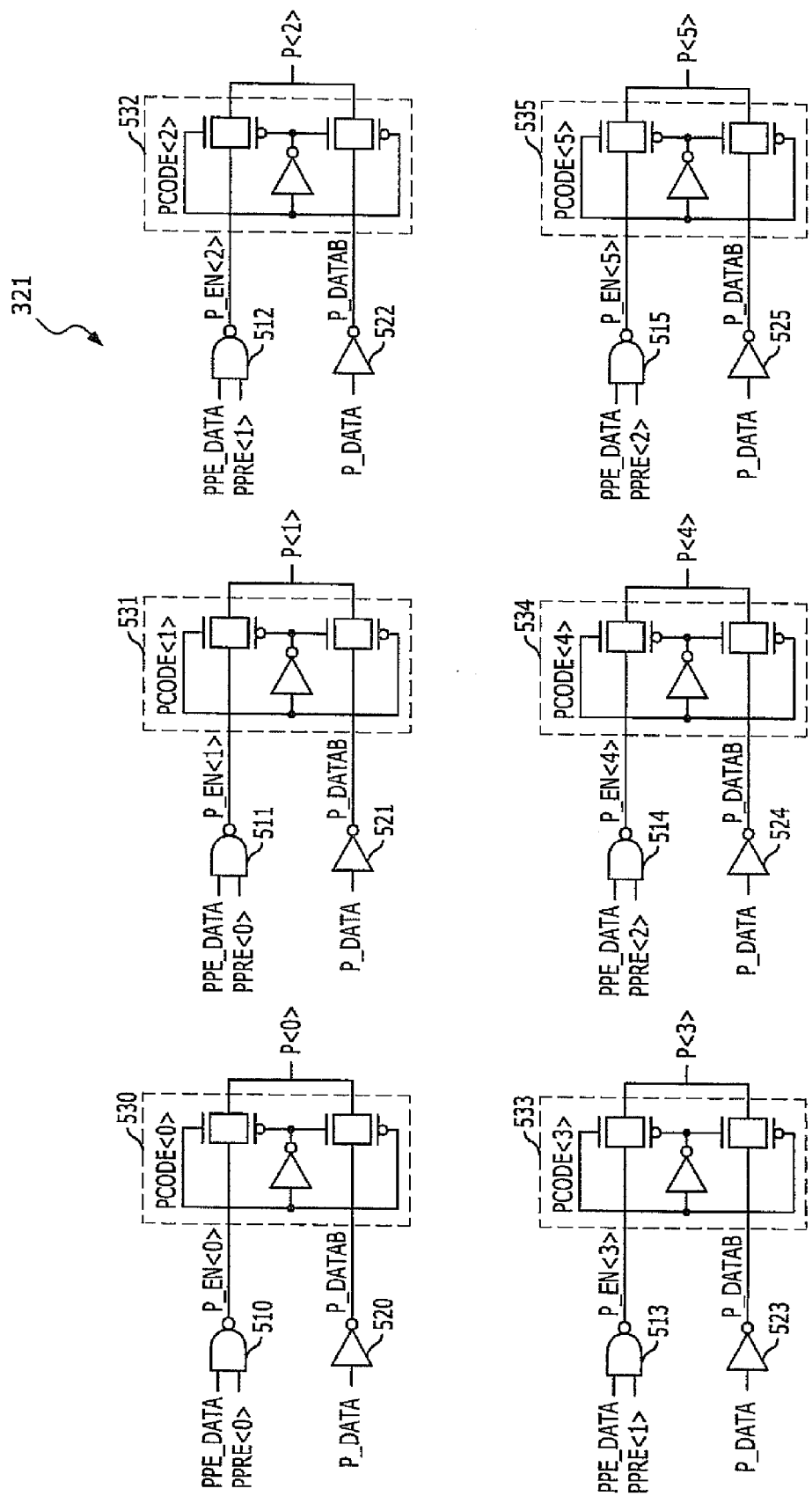
FIG. 5 is a diagram of a pull-up controller illustrated in FIG. 3.

FIG. 5 is a diagram of the pull-up controller 321 illustrated in FIG. 3.

Referring to FIG. 5, the pull-up controller 321 includes NAND gates 510 to 515, inverters 520 to 525, and selectors 530 to 535. The NAND gates 510 to 515 are configured to receive the pull-up pre-emphasis data PPE_DATA and the pull-up pre-emphasis codes PPRE<0:2> to output pull-up pre-emphasis enable signals P_EN<0:5>. The inverters 520 to 525 are configured to invert the data P_DATA to output an inverted data P_DATAB. The selectors 530 to 535 are configured to select one of the inverted data P_DATAB and the pull-up pre-emphasis enable signal P_EN<0:5> to output the selected one as the pull-up control signals P<0:5> in response to the pull-up impedance codes PCODE<0:5>.

When the pull-up impedance codes PCODE<0:5> are low, the selectors 530 to 535 select the inverted data P_DATAB and output the selected inverted data P_DATAB as the pull-up control signals P<0:5>. When the pull-up impedance codes PCODE<0:5> are high, the selectors 530 to 535 select the pull-up pre-emphasis enable signals P_EN<0:5> and output the selected pull-up pre-emphasis enable signals P_EN<0:5> as the pull-up control signals P<0:5>. Therefore, the pull-up control signals P<0:5> output from the selectors 530 to 535 receiving the low pull-up impedance codes PCODE<0:5> are activated to a logic low level so that the pull-up resistors 410 to 415 are turned on only if the data P_DATA is at a logic high level.

In addition, the pull-up control signals P<0:5> output from the selectors 530 to 535 receiving the high pull-up impedance codes PCODE<0:5> are activated to a logic low level, so that the pull-up resistors 410 to 415 are turned on only when both the pull-up pre-emphasis data PPE_DATA and the pull-up pre-emphasis codes PPRE<0:2> are high.

Table 1 below shows the conditions for enabling the pull-up controller 321 to turn on the pull-up resistors 410 to 415.

The resistors 410 to 415 are turned on when meeting the following conditions. For example, the pull-up resistor 410 is turned on when meeting the conditions of P_DATA='H' and PCODE<0>='L' or the conditions of P_DATA='H', PCODE<0>='H', PPE_DATA='H' and PPRE<0>='H'.

TABLE 1

| P_DATA = 'H' | PCODE<0> = 'L' | | | 410: TURNED ON |
|---|---|---|---|---|
| | PCODE<0> = 'H' | PPE_DATA = 'H' | PPRE<0> = 'H' | |
| | PCODE<1> = 'L' | | | 411: TURNED ON |
| | PCODE<1> = 'H' | PPE_DATA = 'H' | PPRE<0> = 'H' | |
| | PCODE<2> = 'L' | | | 412: TURNED ON |
| | PCODE<2> = 'H' | PPE_DATA = 'H' | PPRE<1> = 'H' | |
| | PCODE<3> = 'L' | | | 413: TURNED ON |
| | PCODE<3> = 'H' | PPE_DATA = 'H' | PPRE<1> = 'H' | |
| | PCODE<4> = 'L' | | | 414: TURNED ON |
| | PCODE<4> = 'H' | PPE_DATA = 'H' | PPRE<2> = 'H' | |
| | PCODE<5> = 'L' | | | 415: TURNED ON |
| | PCODE<5> = 'H' | PPE_DATA = 'H' | PPRE<2> = 'H' | |

Referring to Table 1 above, it can be seen that the resistors corresponding to the low value of the pull-up impedance codes PCODE<0:5> are turned on during the normal driving operation, and the resistors corresponding to the high value of the pull-up pre-emphasis codes PPRE<0:2> among the resistors correspond to the high value of the pull-up impedance codes PCODE<0:5> are further turned on during the pre-emphasis driving operation (PPE_DATA='H').

Figure 6:
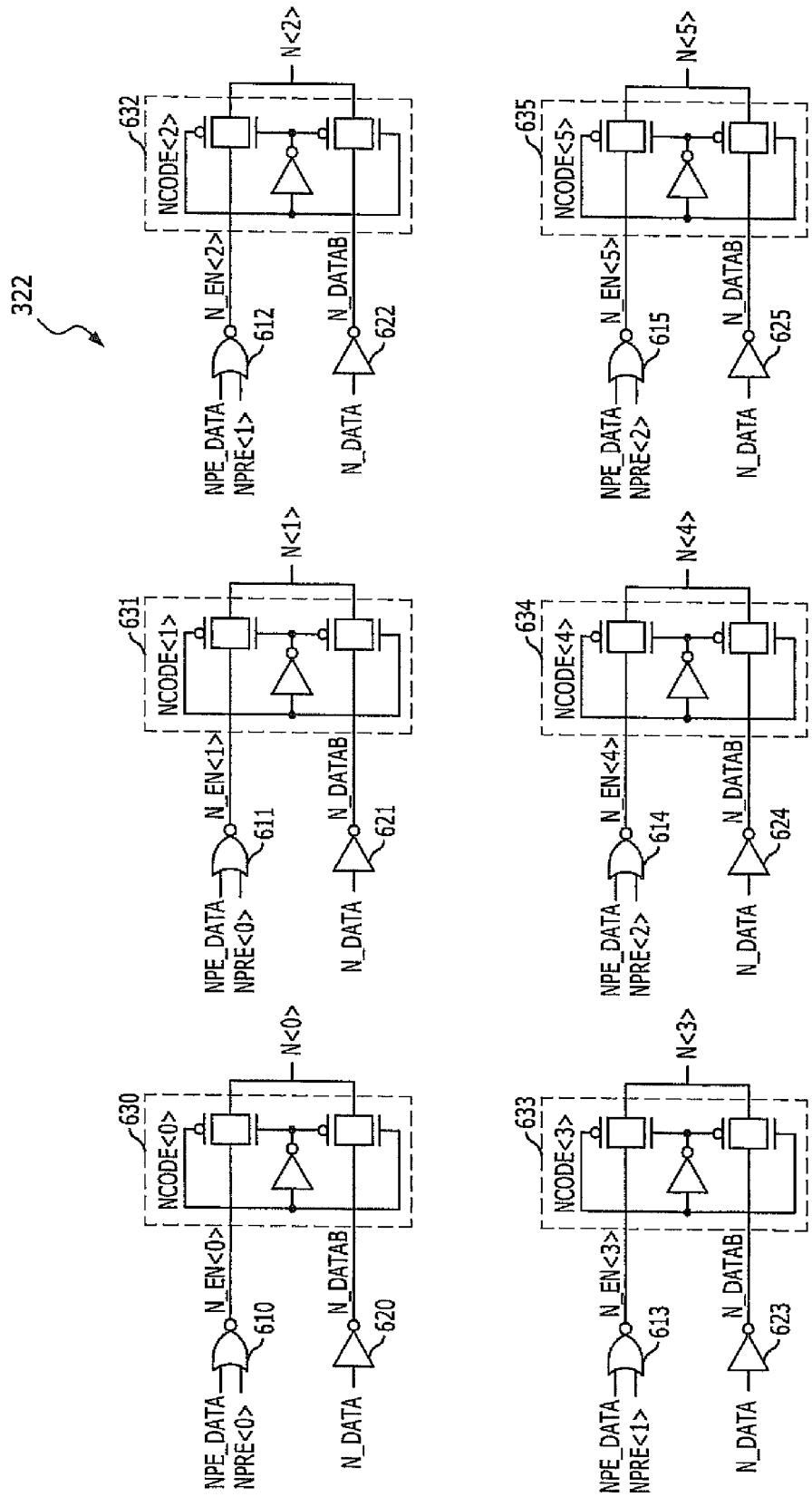
FIG. 6 is a diagram of a pull-down controller illustrated in FIG. 3.

FIG. 6 is a diagram of the pull-down controller 322 illustrated in FIG. 3.

Referring to FIG. 6, the pull-down controller 322 includes NOR gates 610 to 615, inverters 620 to 625, and selectors 630 to 635. The NOR gates 610 to 615 are configured to receive the pull-down pre-emphasis data NPE_DATA and the pull-down pre-emphasis codes NPRE<0:2> to output pull-down pre-emphasis enable signals N_EN<0:5>. The inverters 620 to 625 are configured to invert the data N_DATA to output an inverted data N_DATAB. The selectors 630 to 635 are configured to select one of the inverted data N_DATAB and the pull-down pre-emphasis enable signal N_EN<0:5> to output the selected one as the pull-down control signals N<0:5> in response to the pull-down impedance codes NCODE<0:5>.

When the pull-down impedance codes NCODE<0:5> are high, the selectors 630 to 635 select the inverted data N_DATAB and output the selected inverted data N_DATAB as the pull-down control signals N<0:5>. When the pull-down impedance codes NCODE<0:5> are low, the selectors 630 to 635 select the pull-down pre-emphasis enable signals N_EN<0:5> and output the selected pull-down pre-emphasis enable signals N_EN<0:5> as the pull-down control signals N<0:5>. Therefore, the pull-down control signals N<0:5> output from the selectors 630 to 635 receiving the high pull-down impedance codes NCODE<0:5> are activated to a logic high level so that the pull-down resistors 420 to 425 are turned on only if the data N_DATA is a logic low level.

In addition, the pull-down control signals N<0:5> output from the selectors 630 to 635 receiving the low pull-down impedance codes NCODE<0:5> are activated to a logic high level, so that the pull-down resistors 420 to 425 are turned on only when both the pull-down pre-emphasis data NPE_DATA and the pull-down pre-emphasis codes NPRE<0:2> are low.

Table 2 below shows the conditions for enabling the pull-down controller 322 to turn on the pull-down resistors 420 to 425. The resistors 420 to 425 are turned on when meeting the following conditions. For example, the pull-down resistor 420 is turned on when meeting the conditions of N_DATA='L' and NCODE<0>='H' or the conditions of N_DATA='L', NCODE<0>='L', NPE_DATA='L' and NPRE<0>='L'.

TABLE 2

| N_DATA = 'L' | NCODE<0> = 'H' | | | 420: TURNED ON |
|---|---|---|---|---|
| | NCODE<0> = 'L' | NPE_DATA = 'L' | NPRE<0> = 'L' | |
| | NCODE<1> = 'H' | | | 421: TURNED ON |
| | NCODE<1> = 'L' | NPE_DATA = 'L' | NPRE<0> = 'L' | |
| | NCODE<2> = 'H' | | | 422: TURNED ON |
| | NCODE<2> = 'L' | NPE_DATA = 'L' | NPRE<1> = 'L' | |
| | NCODE<3> = 'H' | | | 423: TURNED ON |
| | NCODE<3> = 'L' | NPE_DATA = 'L' | NPRE<1> = 'L' | |
| | NCODE<4> = 'H' | | | 424: TURNED ON |
| | NCODE<4> = 'L' | NPE_DATA = 'L' | NPRE<2> = 'L' | |
| | NCODE<5> = 'H' | | | 425: TURNED ON |
| | NCODE<5> = 'L' | NPE_DATA = 'L' | NPRE<2> = 'L' | |

Referring to Table 2 above, it can be seen that the resistors corresponding to the high value of the pull-down impedance codes NCODE<0:5> are turned on during the normal driving operation, and the resistors corresponding to the low value of the pull-down pre-emphasis codes NPRE<0:2> among the resistors correspond to the low value of the pull-down impedance codes NCODE<0:5> are further turned on during the pre-emphasis driving operation (NPE_DATA='L').

Figure 7:
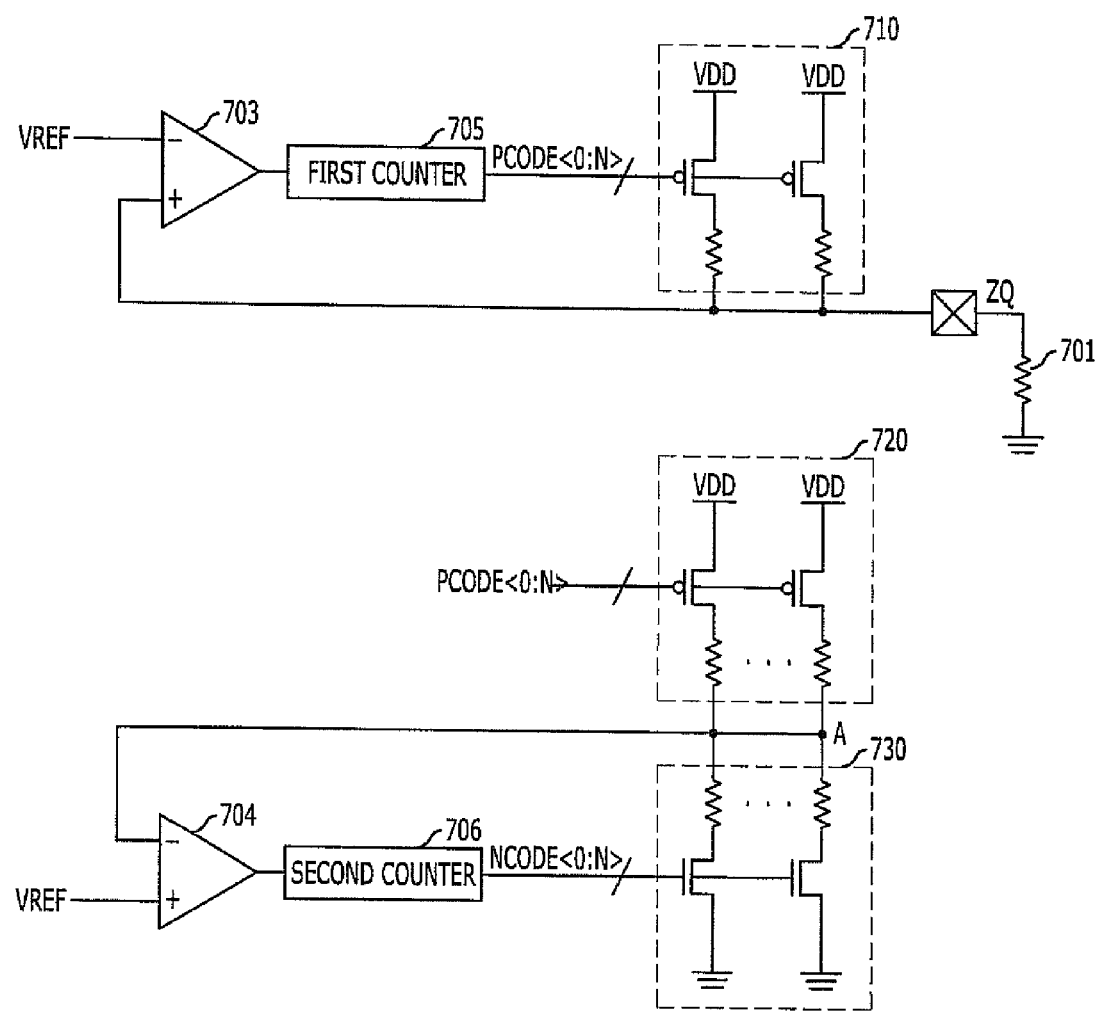
FIG. 7 is a circuit diagram of a calibration circuit for generating pull-down and pull-down impedance codes.

FIG. 7 is a circuit diagram of a calibration circuit for generating the pull-down and pull-down impedance codes PCODE<0:5> and NCODE<0:5>.

In a semiconductor device, such as a DDR3 SDRAM, the calibration circuit of FIG. 7 is provided at the ZQ pad, and the data output circuit of FIG. 3 is provided at the data pad DQ. That is, the circuit for generating the impedance codes PCODE<0:5> and NCODE<0:5> (see FIG. 7) and the circuit for outputting the data (see FIG. 3) are provided within the semiconductor device.

Referring to FIG. 7, the calibration circuit includes a pull-up calibration resistor unit 710, a dummy calibration resistor unit 720, a pull-down calibration resistor unit 730, first and second comparators 703 and 704, and first and second counters 705 and 706.

The pull-up calibration resistor unit 710 includes a plurality of parallel resistors configured to be turned on/off in response to the pull-up impedance codes PCODE<0:5>. The dummy calibration resistor unit 720 has the same configuration as the pull-up calibration resistor unit 710. The pull-down calibration resistor unit 730 includes a plurality of parallel resistors configured to be turned on/off in response to the pull-down impedance codes NCODE<0:5>.

Upon operation, the first comparator 703 compares a reference voltage VREF (generally, VDD/2) with a voltage of a ZQ node coupled between an external resistor 701 connected to the ZQ pad and the pull-up calibration resistor unit 710, and outputs the comparison result. Therefore, the output signal of the first comparator 703 is changed according to whether or not the resistance of the external resistor 701 is greater than the resistance of the pull-up calibration resistor unit 710.

The first counter 705 counts the pull-up impedance codes PCODE<0:5> in response to the output signal of the first comparator 703. The generated pull-up impedance codes PCODE<0:5> calibrate the resistance of the pull-up calibration resistor unit 710 by turning on/off the parallel resistors within the pull-up calibration resistor unit 710. The calibrated resistance of the pull-up calibration resistor unit 710 again influences the voltage of the ZQ node, and the above-described operation is repeated. That is, the pull-up calibration resistor unit 710 is calibrated so that the total resistance of the pull-up calibration resistor unit 710 is equal to the resistance of the external resistor 701.

The pull-up impedance codes PCODE<0:5> generated during the above-described calibration operation are inputted to the dummy calibration resistor unit 720. Since the dummy calibration resistor unit 720 has the same configuration as the pull-up calibration resistor unit 710 and receives the same codes PCODE<0:5>, the resistances of the two resistor units 710 and 720 are equal to each other.

Next, the pull-down calibration operation will be described. The pull-down calibration operation is similar to the pull-up calibration operation. The pull-up calibration operation is performed using the second comparator 704 and the second counter 706, so that the voltage of the node A is equal to the reference voltage VREF, that is, the total resistance of the pull-down calibration resistor unit 730 is equal to the total resistance of the dummy calibration resistor unit 720.

The pull-up impedance codes PCODE<0:5> and the pull-down impedance codes NCODE<0:5> generated by the calibration circuit determine the impedances of the pull-up driver 311 and the pull-down driver 312 of the data output circuit.

Figure 8:
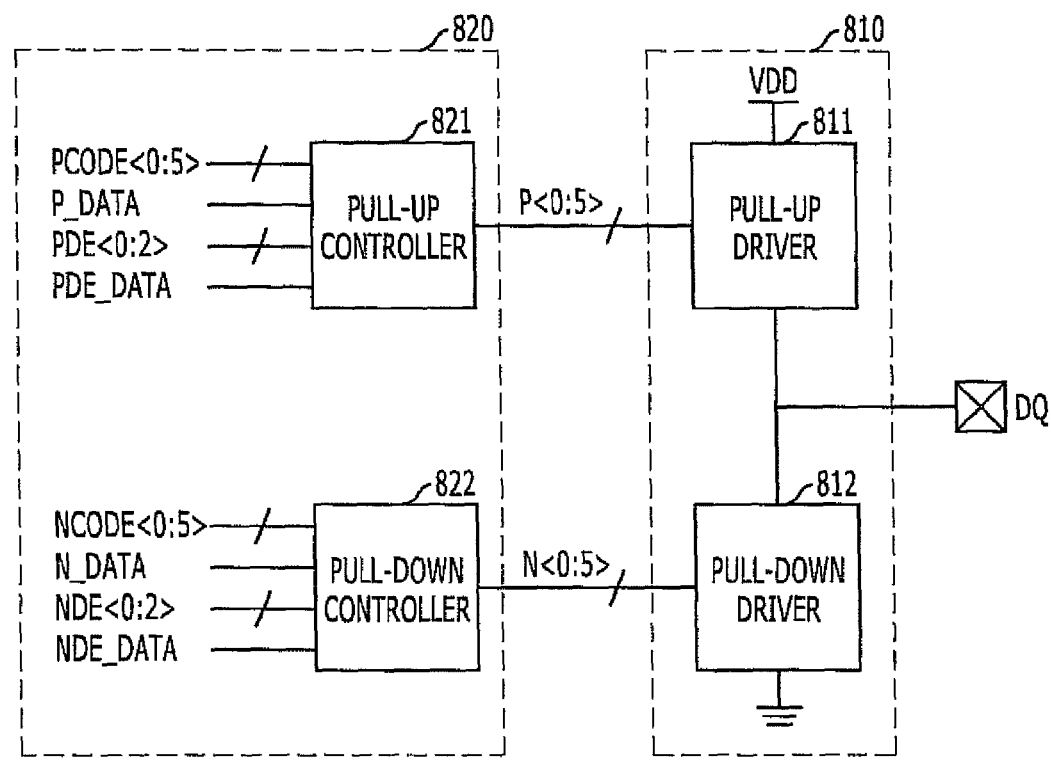
FIG. 8 is a block diagram of a data output circuit in accordance with another embodiment of the present invention.

FIG. 8 is a block diagram of a data output circuit in accordance with another embodiment of the present invention.

Referring to FIG. 8, the data output circuit in accordance with another embodiment of the present invention includes an output unit 810 and a control unit 820. The output unit 810 of FIG. 8 may have substantially the same configuration as the output unit 310 of FIG. 3, and the control unit 820 has a different configuration from the control unit 320 of FIG. 3. While the control unit 320 of FIG. 3 is configured to control the output unit 310 to perform a normal driving operation and a pre-emphasis driving operation, the control unit 820 of FIG. 8 is configured to control the output unit 820 to perform the normal driving operation and a de-emphasis driving operation.

The control unit 820 includes a pull-up controller 821 configured to control a pull-up driver 811, and a pull-down controller 822 configured to control a pull-down driver 812.

The pull-up controller 821 turns on/off a plurality of pull-up resistors according to the pull-up impedance codes PCODE<0:5> when high data P_DATA is output, and turns on some of the pull-up resistors during the de-emphasis period (PDE_DATA='H') where low data P_DATA is output. In addition, the pull-down controller 822 turns on/off a plurality of pull-down resistors according to the pull-down impedance codes NCODE<0:5> when low data N_DATA is output, and turns on some of the pull-down resistors during the de-emphasis period (NDE_DATA='L') where high data N_DATA is output.

The de-emphasis driving operation is to prevent the level of the output node DQ from being excessively increased due to the excellent drivability of the pull-up driver 811, and to prevent the level of the output node DQ from being excessively decreased due to the excellent drivability of the pull-down driver 812. Therefore, the de-emphasis driving operation for preventing the level of the output node DQ from being excessively increased may be performed by slightly driving the pull-down driver 812 when outputting high data P_DATA and N_DATA (when the pull-up driver 811 is being driven). The de-emphasis driving operation for preventing the level of the output node DQ from being excessively decreased may be performed by slightly driving the pull-up driver 811 when outputting low data P_DATA and N_DATA (when the pull-down driver 812 is being driven).

If the first de-emphasis data PDE_DATA is enabled to a logic high level in a period where the low data P_DATA is output through the output node DQ, the pull-up controller 821 controls some resistors of the pull-up driver 811 to be turned on according to first de-emphasis codes PDE<0:2>. In addition, if the second de-emphasis data NDE_DATA is enabled to a logic low level in a period where the high data N_DATA is output through the output node DQ, the pull-down controller 822 controls some resistors of the pull-down driver 812 to be turned on according to second de-emphasis codes NDE<0:2>. In this way, the de-emphasis driving operation is achieved. Through such operations, the de-emphasis operation may be performed only by the output unit 810 for outputting the data P_DATA and N_DATA, without using additional de-emphasis drivers.

Figure 9:
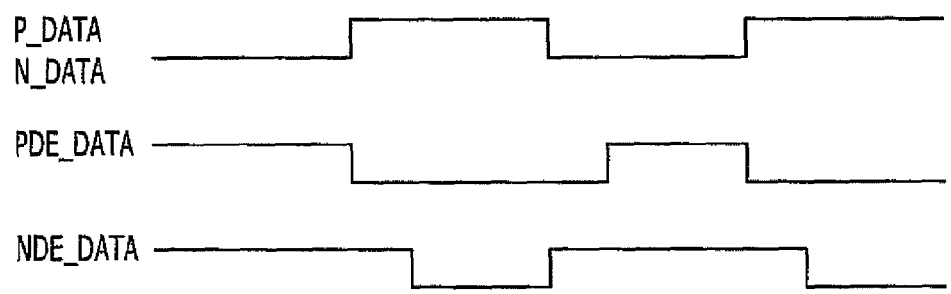
FIG. 9 is a timing diagram illustrating a relationship of data and de-emphasis data.

FIG. 9 is a timing diagram illustrating a relationship of the data P_DATA and N_DATA and the de-emphasis data PDE_DATA and NDE_DATA.

Referring to FIG. 9, in a period where the data P_DATA and N_DATA are high, the second de-emphasis data NDE_DATA is enabled to a logic low level in order to prevent the level of the output node DQ from being excessively increased. Furthermore, in a period where the data P_DATA and N_DATA are low, the first de-emphasis data PDE_DATA is enabled to a logic high level in order to prevent the level of the output node DQ from being excessively decreased. As illustrated in FIG. 9, the de-emphasis data PDE_DATA and NDE_DATA are enabled when the data P_DATA and N_DATA are equally output for more than a certain time.

Figure 10:
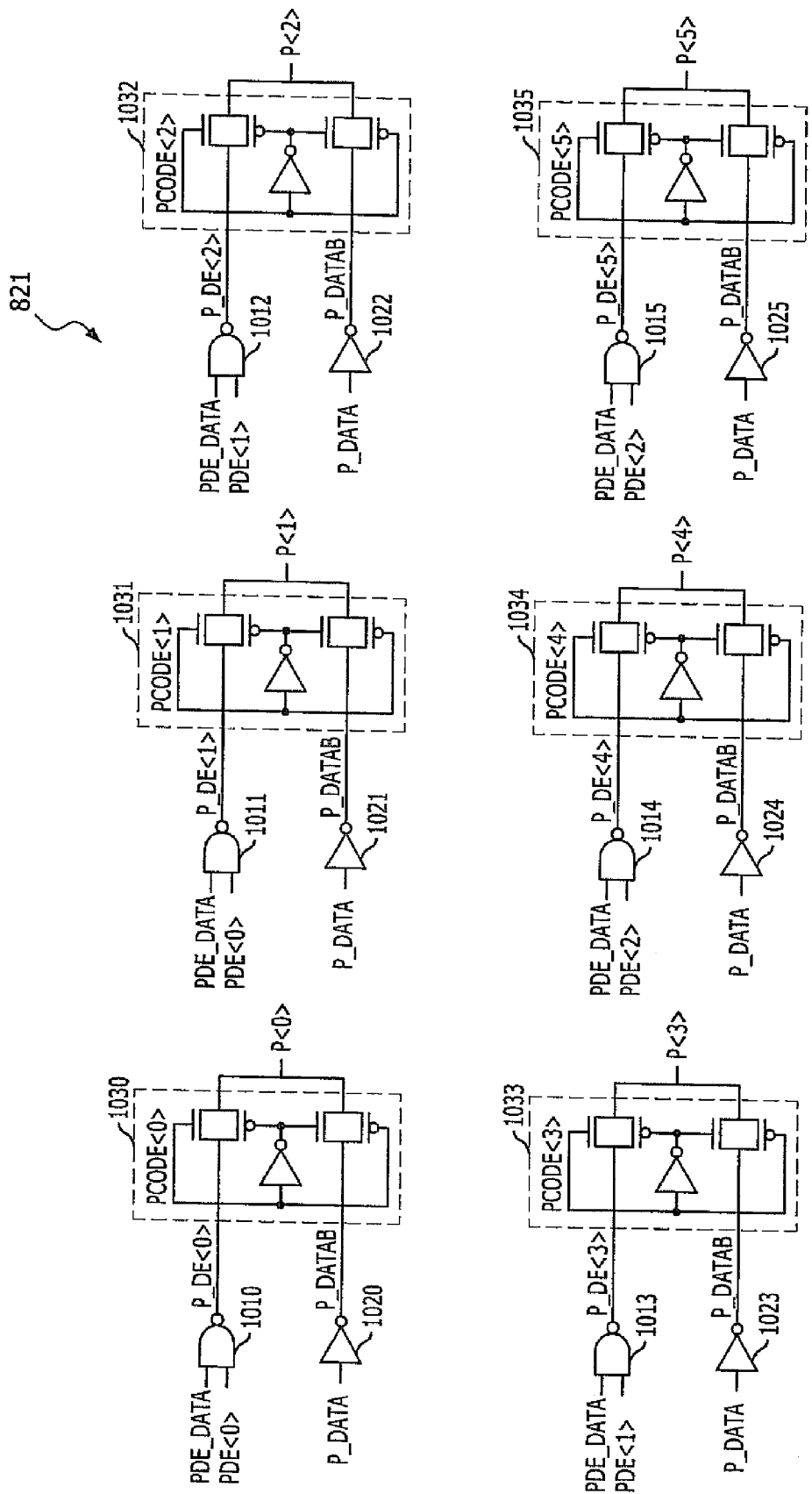
FIG. 10 is a diagram of a pull-up controller illustrated in FIG. 8.

FIG. 10 is a diagram of the pull-up controller 821 illustrated in FIG. 8.

The pull-up controller 821 has substantially the same configuration as the pull-up controller 321 of FIG. 5, but is different from the pull-up controller 321 in that it receives the first de-emphasis data PDE_DATA instead of the pull-up pre-emphasis data PPE_DATA, and receives the first de-emphasis codes PDE<0:2> instead of the pull-up pre-emphasis codes PPRE<0:2>.

In a period where the data P_DATA is high, the pull-up controller 821 turns on/off the pull-up resistors 410 to 415 according to the pull-up impedance codes PCODE<0:5>. If the first de-emphasis data PDE_DATA is enabled to a logic high level in a period where the data P_DATA is low, some of the pull-up resistors 410 to 415 are turned on according to the first de-emphasis codes PDE<0:2>. In this way, the de-emphasis driving operation is achieved.

Table 3 below shows conditions for enabling the pull-up controller 821 to turn on the pull-up resistors 410 to 415. The resistors 410 to 415 are turned on when meeting the following conditions. For example, the pull-up resistor 410 is turned on when meeting the conditions of P_DATA='H' and PCODE<0>='L' or the conditions of P_DATA='L', PCODE<0>='H', PDE_DATA='H' and PDE<0>='H'.

TABLE 3

| | | | | |
|---|---|---|---|---|
| P_DATA = 'H' | PCODE<0> = 'L' | | | 410: TURNED ON |
| | PCODE<1> = 'L' | | | 411: TURNED ON |
| | PCODE<2> = 'L' | | | 412: TURNED ON |
| | PCODE<3> = 'L' | | | 413: TURNED ON |
| | PCODE<4> = 'L' | | | 414: TURNED ON |
| | PCODE<5> = 'L' | | | 415: TURNED ON |
| P_DATA = 'L' | PCODE<0> = 'H' | PDE_DATA = 'H' | PDE<0> = 'H' | 410: TURNED ON |
| | PCODE<1> = 'H' | PDE_DATA = 'H' | PDE<0> = 'H' | 411: TURNED ON |
| | PCODE<2> = 'H' | PDE_DATA = 'H' | PDE<1> = 'H' | 412: TURNED ON |
| | PCODE<3> = 'H' | PDE_DATA = 'H' | PDE<1> = 'H' | 413: TURNED ON |
| | PCODE<4> = 'H' | PDE_DATA = 'H' | PDE<2> = 'H' | 414: TURNED ON |
| | PCODE<5> = 'H' | PDE_DATA = 'H' | PDE<2> = 'H' | 415: TURNED ON |

Referring to Table 3 above, it can be seen that some of the pull-up resistors 410 to 415 inside the pull-up driver 811 are turned on during the de-emphasis driving operation, even though the data P_DATA is low.

Figure 11:
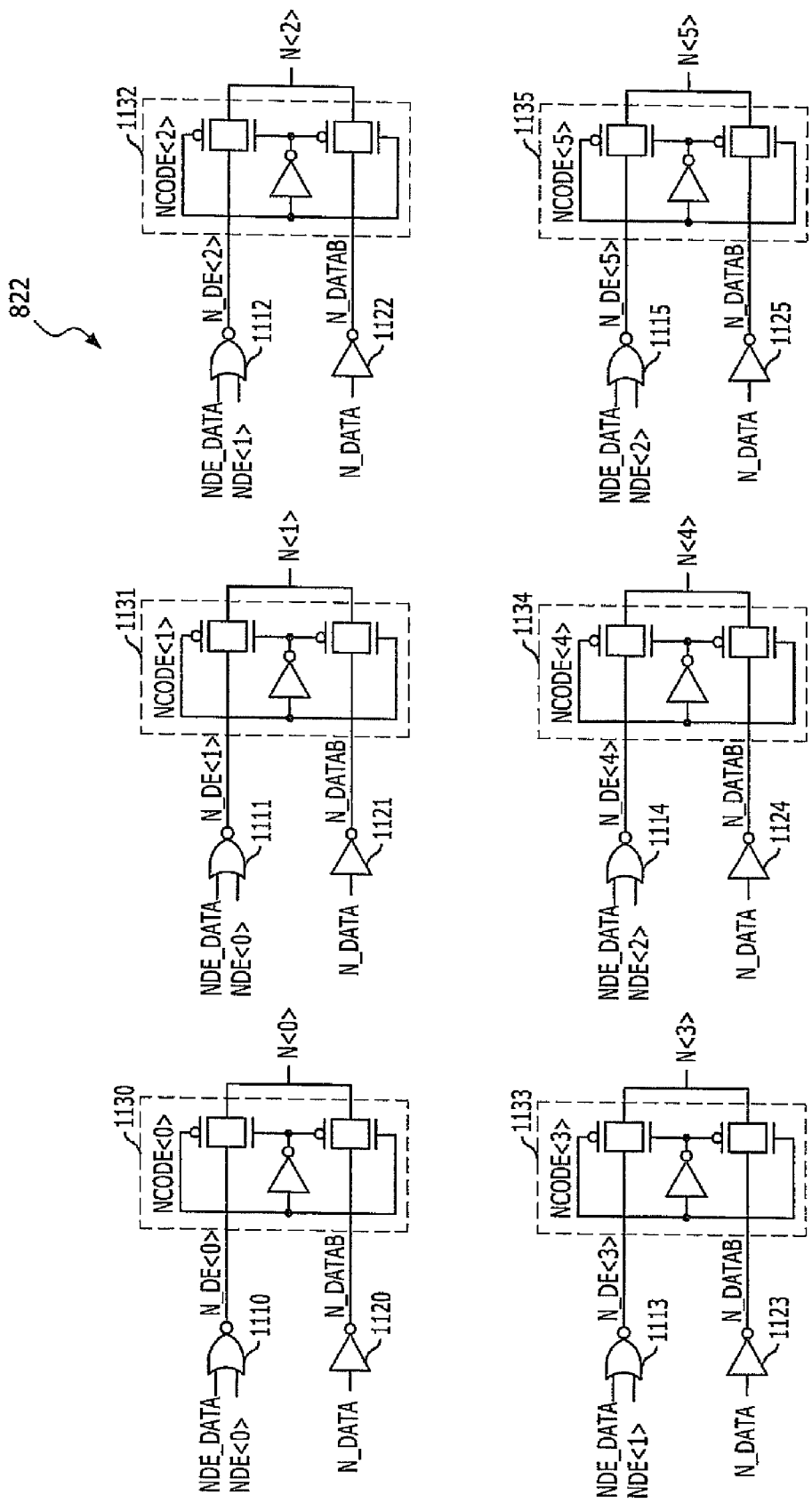
FIG. 11 is a diagram of a pull-down controller illustrated in FIG. 8.

FIG. 11 is a diagram of the pull-down controller 822 illustrated in FIG. 8.

The pull-down controller 822 has substantially the same configuration as the pull-down controller 322 of FIG. 6, but is different from the pull-down controller 322 in that it receives the second de-emphasis data NDE_DATA instead of the pull-down pre-emphasis data NPE_DATA, and receives the second de-emphasis codes NDE<0:2> instead of the pull-down pre-emphasis codes NPRE<0:2>.

In a period where the data N_DATA is low, the pull-down controller 822 turns on/off the pull-down resistors 420 to 425 according to the pull-down impedance codes NCODE<0:5>. If the second de-emphasis data NDE_DATA is enabled to a logic low level in a period where the data N_DATA is high, some of the pull-down resistors 420 to 425 are turned on according to the second de-emphasis codes NDE<0:2>, In this way, the de-emphasis driving operation is achieved.

Table 4 below shows conditions for enabling the pull-down controller 822 to turn on the pull-down resistors 420 to 425. The resistors 420 to 425 are turned on when meeting the following conditions. For example, the pull-down resistor 420 is turned on when meeting the conditions of N_DATA='L' and NCODE<0>='H' or the conditions of N_DATA='H', NCODE<0>='L', NDE_DATA='L' and NDE<0>='L'.

TABLE 4

| | | | | |
|---|---|---|---|---|
| N_DATA = 'L' | NCODE<0> = 'H' | | | 420: TURNED ON |
| | NCODE<1> = 'H' | | | 421: TURNED ON |
| | NCODE<2> = 'H' | | | 422: TURNED ON |
| | NCODE<3> = 'H' | | | 423: TURNED ON |
| | NCODE<4> = 'H' | | | 424: TURNED ON |
| | NCODE<5> = 'H' | | | 425: TURNED ON |
| N_DATA = 'H' | NCODE<0> = 'H' | NDE_DATA = 'L' | NDE<0> = 'L' | 420: TURNED ON |
| | NCODE<1> = 'H' | NDE_DATA = 'L' | NDE<0> = 'L' | 421: TURNED ON |
| | NCODE<2> = 'H' | NDE_DATA = 'L' | NDE<1> = 'L' | 422: TURNED ON |
| | NCODE<3> = 'L' | NDE_DATA = 'L' | NDE<1> = 'L' | 423: TURNED ON |
| | NCODE<4> = 'L' | NDE_DATA = 'L' | NDE<2> = 'L' | 424: TURNED ON |
| | NCODE<5> = 'L' | NDE_DATA = 'L' | NDE<2> = 'L' | 425: TURNED ON |

Referring to Table 4 above, it can be seen that some of the pull-down resistors 420 to 425 inside the pull-down driver 821 are turned on during the de-emphasis driving operation, even though the data N_DATA is high.

In accordance with the exemplary embodiments of the present invention, the pre-emphasis driving operation is performed by further turning on the turned-off resistors within the pull-up driver and the turned-off resistors within the pull-down driver. Therefore, no additional pre-emphasis drivers are required, thereby reducing the circuit area of the output circuit and reducing the capacitance of the output node.

Furthermore, since the de-emphasis driving operation is performed using the resistors within the pull-up driver and the pull-down driver, no additional de-emphasis drivers are required.

While the present invention has been described with respect to the exemplary embodiments, it will be apparent to those skilled in the art that various changes and modifications may be made without departing from the spirit and scope of the present invention as defined by the following claims.

What is claimed is:

1. A data output circuit, comprising:
    a pull-up driver including a plurality of pull-up resistors to pull up an output node in response to a pull-up driver control signal;
    a pull-down driver including a plurality of pull-down resistors to pull down the output node in response to a pull-down control signal;
    a pull-up controller configured to selectively transfer one of output data and a pull-up pre-emphasis enable signal according to pull-up impedance codes as the pull-up driver control signal for controlling a number of the pull-up resistors to be coupled to the output node; and
    a pull-down controller configured to selectively transfer one of the output data and a pull-down pre-emphasis enable signal according to pull-down impedance codes as the pull-down driver control signal for controlling a number of the pull-down resistors to be coupled to the output node.

2. The data output circuit of claim 1, wherein the number of pull-up resistors in the pull-up driver is increased during the pre-emphasis period according to pull-up pre-emphasis codes, and the number of pull-down resistors in the pull-down driver is increased during the pre-emphasis period is according to pull-down pre-emphasis codes.

3. The data output circuit of claim 1, wherein the pull-up controller comprises a plurality of selectors configured to selectively transfer one of the output data and the pull-up pre-emphasis enable signal as the pull-up driver control signal to the pull-up driver according to the pull-up impedance codes.

4. The data output circuit of claim 3, wherein each of the selectors is configured to transfer the output data as the pull-up driver control signal to the pull-up driver to couple a corresponding pull-up resistors to the output node according to the pull-up impedance codes, and to transfer the pull-up pre-emphasis enable signal as the pull-up driver control signal to the pull-up driver to couple the pull-up resistors to the output node according to the pull-up impedance codes.

5. The data output circuit of claim 3, wherein the pull-up pre-emphasis enable signal is a signal comprising a combination of pull-up pre-emphasis data and pull-up pre-emphasis codes.

6. The data output circuit of claim 1, wherein the pull-down controller comprises a plurality of selectors configured to selectively transfer one of the output data and the pull-down pre-emphasis enable signal as the pull-down driver control signal to the pull-down driver according to the pull-down impedance codes.

7. The data output circuit of claim 6, wherein each of the selectors is configured to transfer the output data as the pull-down driver control signal to the pull-down driver to couple the pull-down resistor to the output node according to the pull-down impedance codes, and to transfer the pull-down pre-emphasis enable signal as the pull-down driver control signal to the pull-down driver to couple the pull-down resistor to the output node according to the pull-down impedance codes.

8. The data output circuit of claim 6, wherein the pull-down pre-emphasis enable signal is a signal comprising a combination of pull-down pre-emphasis data and pull-down pre-emphasis codes.

9. A data output circuit, comprising:
an impedance code generator configured to generate pull-up impedance codes for determining a pull-up impedance value of the data output circuit, and generate pull-down impedance codes for determining a pull-down impedance value of the data output circuit;
a pull-up driver including a plurality of pull-up resistors to pull up a data pad;
a pull-down driver including a plurality of pull-down resistors to pull down the data pad;
a pull-up controller configured to control the plurality of pull-up resistors to be coupled to the data pad according to the pull-up impedance codes when logic high level data is outputted, and to increase a number of the pull-up resistors according to the pull-up impedance codes during a pre-emphasis period; and
a pull-down controller configured to control the plurality of pull-down resistors to be coupled to the data pad according to the pull-down impedance codes when logic low level data is outputted, and to increase a number of the pull-down resistors according to the pull-down impedance codes during the pre-emphasis period,
wherein the number of pull-up resistors to be coupled to the data pad during the pre-emphasis period changes according to pull-up pre-emphasis codes, and the number of pull-down resistors to be coupled to the data pad during the pre-emphasis period changes according to pull-down pre-emphasis codes.

10. A data output circuit, comprising:
a pull-up driver including a plurality of pull-up resistors to pull up an output node;
a pull-down driver including a plurality of pull-down resistors to pull down the output node;
a pull-up controller configured to control the plurality of pull-up resistors to be coupled to the output node according to pull-up impedance codes, when logic high level data is outputted, and to increase a number of the pull-up resistors during a de-emphasis period when logic low level data is outputted; and
a pull-down controller configured to control the plurality of pull-down resistors to be coupled to the output node according to pull-down impedance codes, when logic low level data is outputted, and to increase a number of the pull-down resistors during the de-emphasis period when logic high level data is outputted,
wherein the number of pull-up resistors to be coupled to the output node during the de-emphasis period, when the logic low level data is outputted, changes according to first de-emphasis codes, and the number of pull-down resistors to be coupled to the output node during the de-emphasis period, when the logic high level data is outputted, changes according to second de-emphasis codes.

11. The data output circuit of claim 10, wherein the pull-up controller comprises a plurality of selectors configured to selectively transfer one of output data and a first de-emphasis enable signal to the pull-up driver according to the pull-up impedance codes.

12. The data output circuit of claim 10, wherein the pull-down controller comprises a plurality of selectors configured to selectively transfer one of output data and a second de-emphasis enable signal to the pull-down driver according to the pull-down impedance codes.

* * * * *